(12) United States Patent
Chen et al.

(10) Patent No.: US 12,417,949 B2
(45) Date of Patent: Sep. 16, 2025

(54) MULTI-LAYERED STRUCTURE AND METHOD FOR MANUFACTURING THE SAME

(71) Applicant: InnoLux Corporation, Miao-Li County (TW)

(72) Inventors: Liang-Lu Chen, Miao-Li County (TW); Kuang-Ming Fan, Miao-Li County (TW); Chia-Lin Yang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 741 days.

(21) Appl. No.: 17/529,549

(22) Filed: Nov. 18, 2021

(65) Prior Publication Data

US 2023/0085198 A1 Mar. 16, 2023

(30) Foreign Application Priority Data

Sep. 16, 2021 (CN) .......................... 202111085457.3

(51) Int. Cl.
*H01L 21/66* (2006.01)
*H01L 21/56* (2006.01)
*H01L 21/683* (2006.01)
*H01L 23/544* (2006.01)

(52) U.S. Cl.
CPC .......... *H01L 22/12* (2013.01); *H01L 21/6835* (2013.01); *H01L 22/20* (2013.01); *H01L 23/544* (2013.01); *H01L 21/568* (2013.01); *H01L 22/34* (2013.01); *H01L 2221/68345* (2013.01);

(Continued)

(58) Field of Classification Search
CPC ..... H01L 22/12; H01L 21/6835; H01L 22/20; H01L 23/544; H01L 21/568; H01L 22/34; H01L 2221/68345; H01L 2221/68372; H01L 2223/54486
See application file for complete search history.

(56) References Cited

U.S. PATENT DOCUMENTS 6,177,682 B1 * 1/2001 Bartulovic ........... G01N 21/951
250/559.44
6,815,234 B2 * 11/2004 Wellhausen ........... H10B 53/00
257/E21.663

(Continued)

FOREIGN PATENT DOCUMENTS

CN 101005061 A 7/2007
CN 112530912 A 3/2021
JP H08271235 A 10/1996

OTHER PUBLICATIONS

Chinese language office action dated Jul. 23, 2025, issued in application No. CN 202111085457.3.

*Primary Examiner* — Britt D Hanley
*Assistant Examiner* — Victor V Barzykin
(74) *Attorney, Agent, or Firm* — McClure, Qualey & Rodack, LLP

(57) ABSTRACT

A method for manufacturing a multi-layered structure on a supporting entity is provided. The method includes forming a first layer and a first test mark on the supporting entity, wherein the first test mark has a first predetermined length. The first projected length of the first test mark is measured in a top view. The first warpage degree of the first test mark is calculated according to the first predetermined length and the first projected length.

7 Claims, 14 Drawing Sheets

(52) U.S. Cl.
CPC ............... *H01L 2221/68372* (2013.01); *H01L 2223/54486* (2013.01)

(56) References Cited

U.S. PATENT DOCUMENTS

| | | | |
|---|---|---|---|
| 7,573,138 B2 * | 8/2009 | Lee | H01L 24/05 257/786 |
| 11,063,022 B2 | 7/2021 | Chen et al. | |
| 2015/0179616 A1 * | 6/2015 | Lin | H01L 23/3121 257/773 |

* cited by examiner

MULTI-LAYERED STRUCTURE AND METHOD FOR MANUFACTURING THE SAME

CROSS REFERENCE TO RELATED APPLICATIONS

This application claims priority of China Patent Application No. CN 202111085457.3, filed on Sep. 16, 2021, the entirety of which is incorporated by reference herein.

TECHNICAL FIELD

Some embodiments of the present disclosure relate to a multi-layered structure and a method for manufacturing the same, and, in particular, to an multi-layered structure disposed on a supporting entity and having a test mark therein and a method for manufacturing the same.

BACKGROUND

In general, an electronic device may include a multilayer structure, such as conductive layers, insulating layers, and/or other functional layers. Since there is a difference between the layers in properties such as the coefficient of thermal expansion, warpage can occur when the layers are stacked. However, there is still room for improvement in the manual use of a thickness gauge to measure the warpage degree.

SUMMARY

In view of the foregoing problems, the present disclosure calculates the warpage degree at the position of the test mark according to a predetermined length and a projected length by disposing the test mark with the predetermined length on the first layer and measuring the projected length of the test mark in a top view. Therefore, the test mark may be disposed in a suitable position according to the usage requirements. Thus, during measurement, the measuring time may be shortened, the accuracy of the measurement may be improved and the possibility of damage to the multilayer structure may be prevented.

According to some embodiments of the present disclosure, a method for manufacturing a multi-layered structure on a supporting entity is provided. The method includes forming a first layer and a first test mark on the supporting entity, wherein the first test mark has a first predetermined length. The first projected length of the first test mark is measured in the top view. The first warpage degree of the first test mark is calculated according to the first predetermined length and the first projected length.

According to some embodiments of the present disclosure, a multi-layered structure disposed on a supporting entity is provided. The multi-layered structure includes a first layer, a first test mark, a second layer, and a second test mark. The first layer is disposed on the supporting entity. The first test mark is disposed on the supporting entity. The second layer is disposed on the first layer. The second test mark is disposed on the first layer, wherein one of the first layer and the second layer is a conductive layer, and the other of the first layer and the second layer is an insulating layer.

The multi-layered structure of the present disclosure may be applied in various types of electronic devices. In order to make the features and advantages of some embodiments of the present disclosure more understand, some embodiments of the present disclosure are listed below in conjunction with the accompanying drawings, and are described in detail as follows.

BRIEF DESCRIPTION OF THE DRAWINGS

Through the following detailed description and the accompanying drawings, a person of ordinary skill in the art will better understand the viewpoints of some embodiments of the present disclosure. It should be noted that, in accordance with standard practice in the industry, various features are not drawn to scale and are used for illustration purposes. In fact, the dimensions of the various features may be arbitrarily increased or reduced for clarity of discussion.

Figure 1:
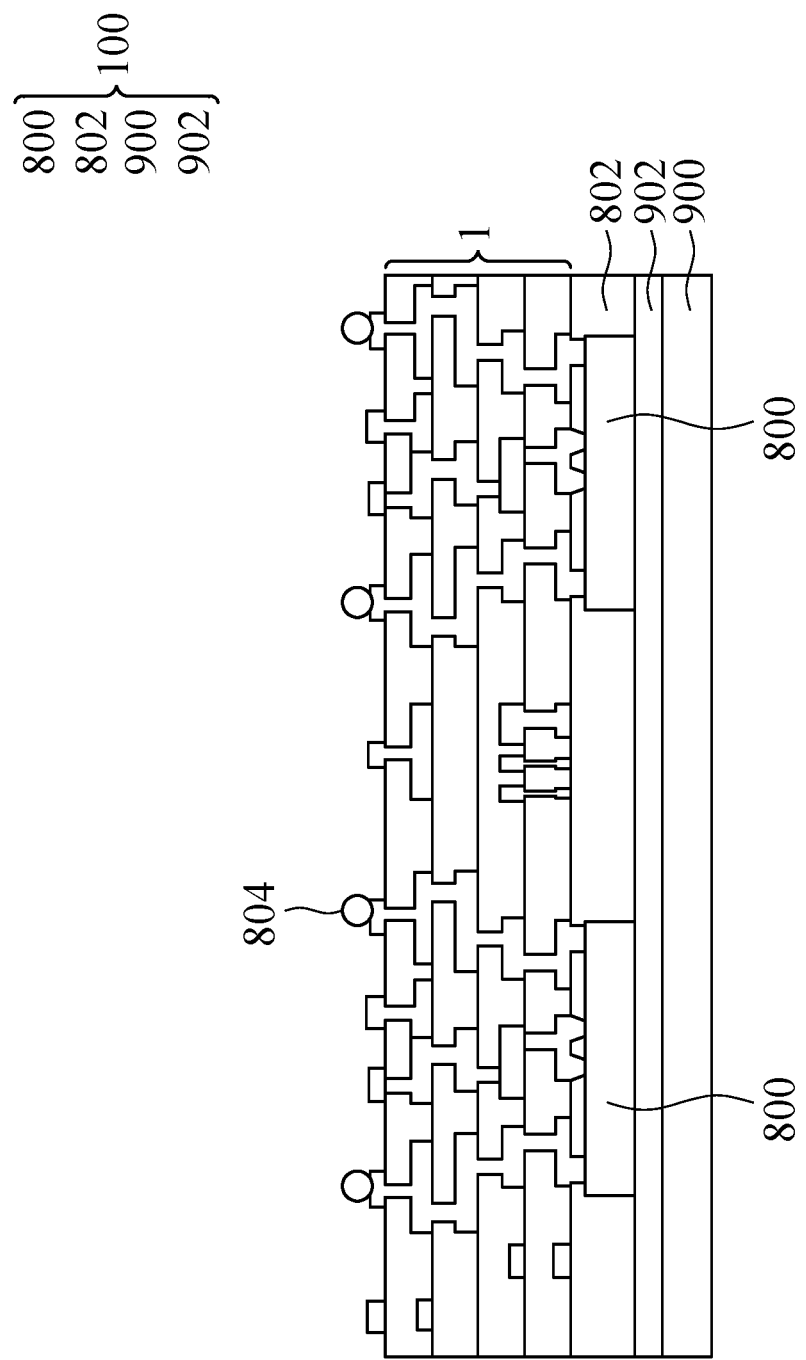
FIG. 1 and FIG. 2 are schematic structure views of the semi-finished products of the semiconductor package manufactured according to different manufacturing processes in the present disclosure.

The following disclosure provides many different embodiments or examples for implementing different features of the multilayer structure disclosed herein. Specific examples of each feature and its configuration are described below to simplify the embodiments of the present disclosure. Naturally, these are examples and are not intended to limit the present disclosure. For example, if the description mentions that the first feature is formed on the second element, it may include an embodiment in which the first feature and second feature are in direct contact, or may include an embodiment in which additional feature is formed between the first feature and the second feature thereby the first feature and the second feature do not directly contact.

DETAILED DESCRIPTION

Some modifications of the embodiments are described below. In the different drawings and illustrated embodiments, similar reference numerals are used to designate similar components. It should be understood that additional operations may be provided before, during, and after the method, and some of the described operations may be replaced or deleted for other embodiments of the method. In addition, the embodiment of the present disclosure may repeat reference numerals and/or letters in different examples. Such repetition is for conciseness and clarity, and is not used to indicate the relationship between the different embodiments and/or aspects discussed herein.

In some embodiments of the present disclosure, terms related to bonding, such as "connect" and the like, unless specifically defined, may refer that two structures are in direct contact, or may also refer that two structures are not in direct contact wherein another structure is disposed between the two structures. The terms related to bonding may also include the embodiments where both structures are movable or both structures are fixed.

In addition, the "first", "second", and the like mentioned in the specification or claims are used to name different elements or distinguish different embodiments or scopes and are not used to limit the upper limit or lower limit of the number of the elements and are not used to limit the manufacturing order or the arrangement order of the elements.

Herein, directions are not limited to three axes of a rectangular coordinate system, such as the X-axis, Y-axis, and Z-axe, and may be interpreted in a broader sense. For example, the X-axis, the Y-axis, and the Z-axis may be perpendicular to one another, or may represent different directions that are not perpendicular to one another.

Although the multilayer structure of the present disclosure is described by taking a semiconductor package structure applied in an electronic device as an example, the present disclosure is not limited thereto. In some embodiments, the multilayer structure disclosed in the present disclosure may be used in other electronic devices such as display devices, antenna devices, sensing devices, light-emitting devices, and touch displays, but the present disclosure is not limited thereto. For example, in some embodiments, the multilayer structure including test marks disclosed in the present disclosure can be applied in any manufacturing process that requires warpage measurement, such as a printed circuit board (PCB), a fan-out wafer level package (FOWLP), a fan-out panel level package (FOPLP), and the like, but the present disclosure is not limited thereto. The test mark of the present disclosure can be disposed in any manufacturing stage so as to perform the warpage measurement.

Figure 2:
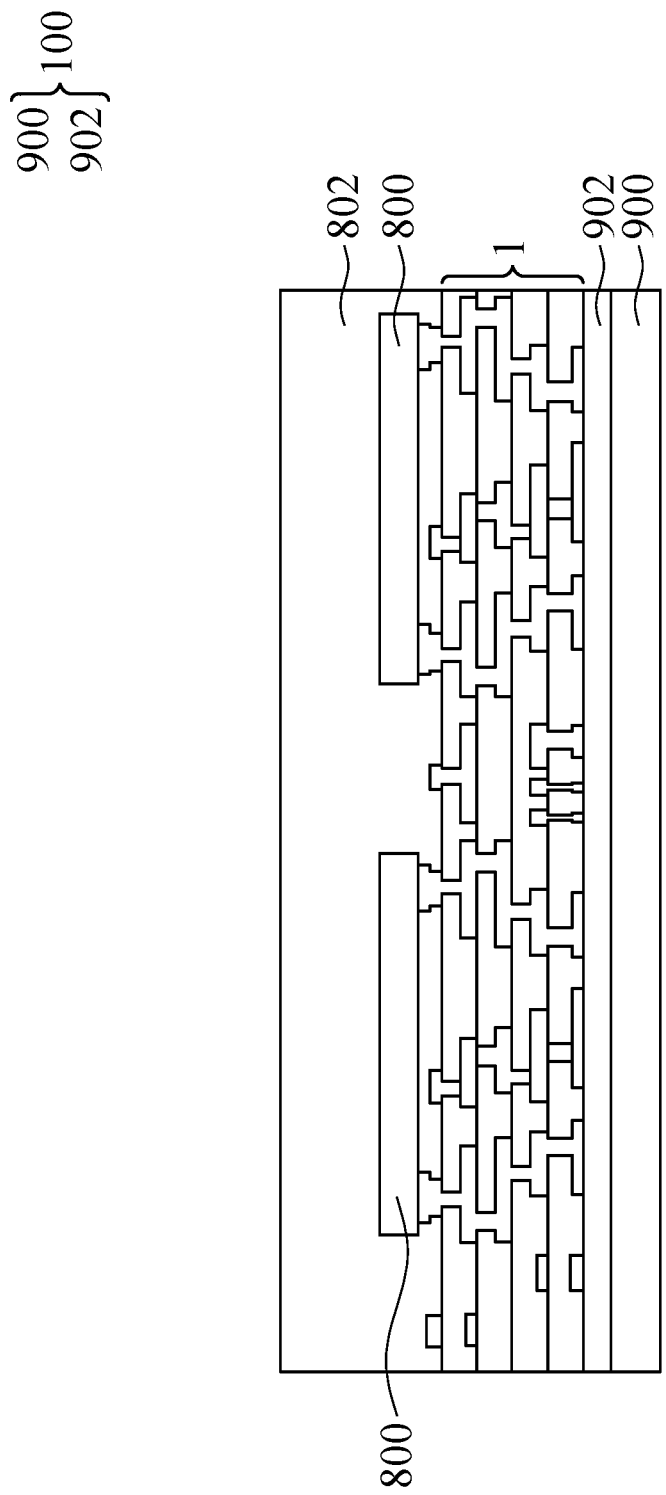

Referring to FIGS. 1 and 2, which are schematic structure views of the semi-finished products of the semiconductor package manufactured according to different manufacturing processes. In the semiconductor packaging process, the semiconductor chip and the re-distribution layer (RDL) having a multilayer structure are connected with each other. Depending on the process order, the semiconductor packaging process can be roughly classified to two types: a chip-first process and a RDL-first process. As shown in FIG. 1, in the chip-first process, a chip 800 is firstly disposed on a substrate 900, and a packaging material 802 is disposed around the chip 800 to package the chip 800. A releasing layer 902 may be disposed between the substrate 900 and the chip 800, so that the chip 800 may be easily separated from the substrate 900. In the embodiment shown in FIG. 1, the chip 800, the packaging material 802, the substrate 900 and the releasing layer 902 may form a supporting entity 100. A multilayer structure 1 including patterned wiring and an insulating layer is subsequently formed on the supporting entity 100. Solder balls 804 are disposed on the multilayer structure 1. As shown in FIG. 2, in the RDL-first process, the multilayer structure 1 including the patterned wiring and the insulating layer are formed on the substrate 900 and the releasing layer 902, wherein the releasing layer 902 is disposed between the substrate 900 and the multilayer structure 1. In the RDL-first process, the substrate 900 and the releasing layer 902 form the supporting entity 100. After the formation of the multilayer structure 1, the chip 800 and the packaging material 802 are disposed on the multilayer structure 1. As mentioned above, during the formation of the multilayer structure 1, there is difference between the layers in properties such as coefficient of thermal expansion. Thus, the warpage may be easily occurred when the layers are stacked. The method of measuring warpage by using the test mark included in the multilayer structure will be described below.

Figure 3:
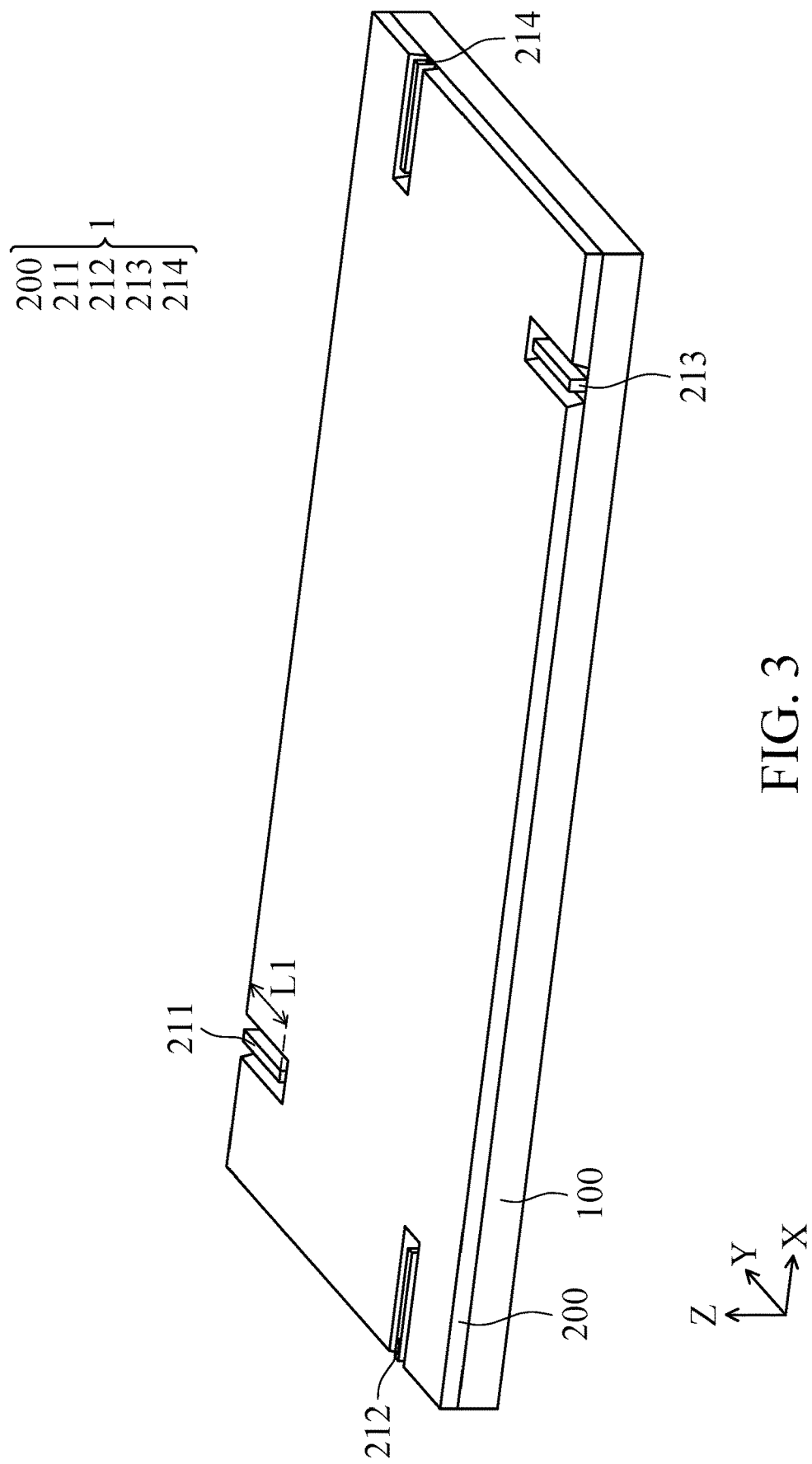
FIG. 3 to FIG. 5 are respectively a schematic three-dimensional view, a schematic cross-sectional view, and a schematic top view of manufacturing a multilayer structure at various stages according to some embodiments of the present disclosure.
Figure 4:
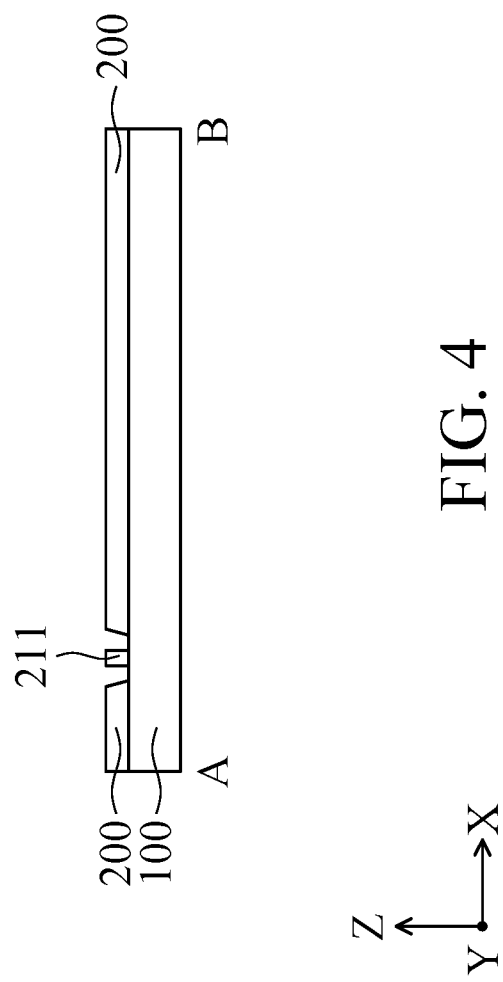
Figure 5:
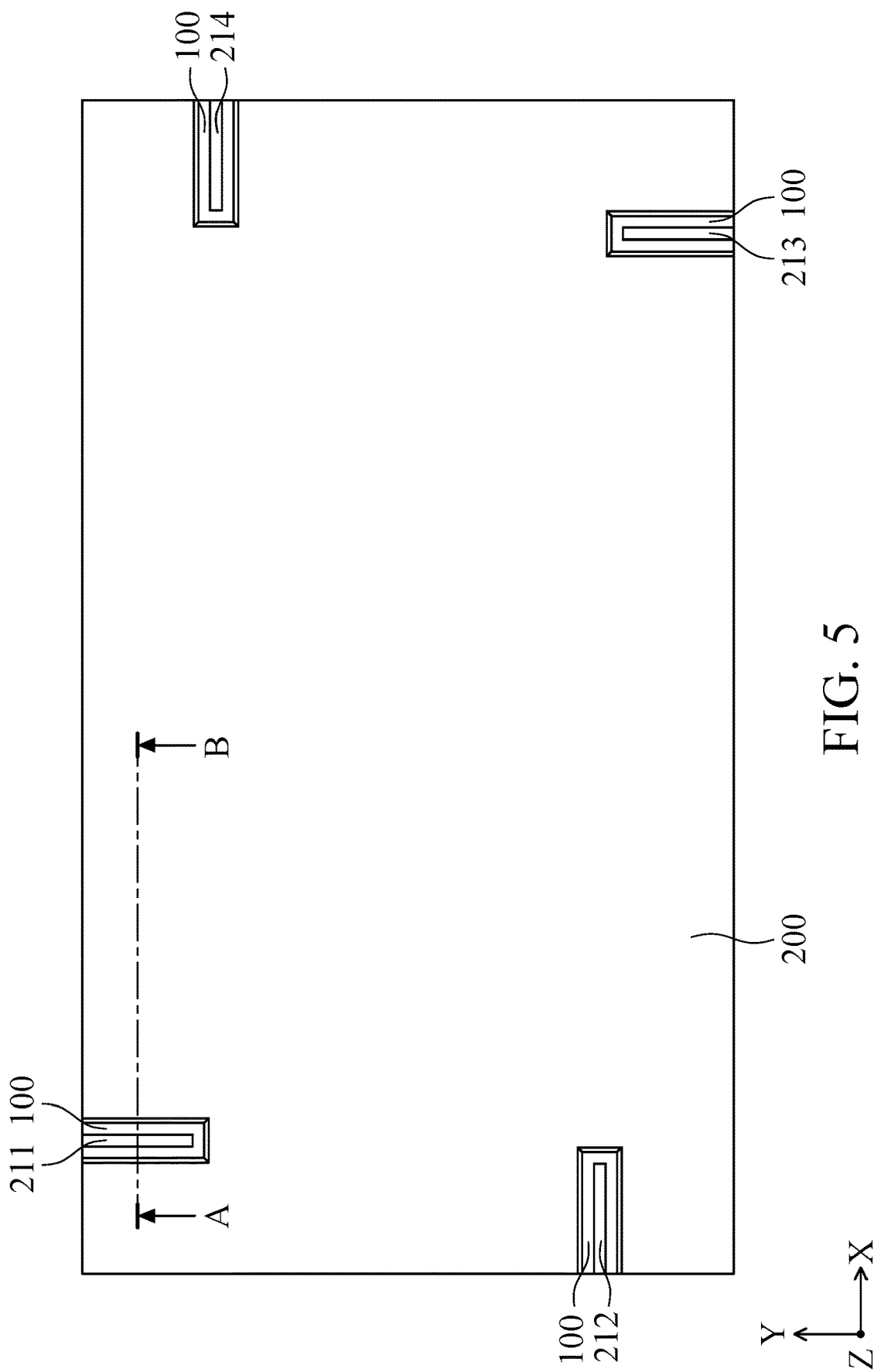

Referring to FIGS. 3 to 5, which are a schematic three-dimensional view, a schematic cross-sectional view, and a schematic top view of manufacturing a multilayer structure 1 at various stages according to some embodiments of the present disclosure, wherein FIG. 5 is a schematic top view of FIG. 3, and FIG. 4 is a cross-sectional view taking along line AB of FIG. 5.

As shown in FIG. 3, the supporting entity 100 as described above is provided. A first layer 200 is formed on the supporting entity 100. In some embodiments, the first layer 200 is directly formed on the supporting entity 100. In some embodiments, the first layer 200 and a test mark such as the first test mark 211 may be disposed on the supporting entity 100.

In some embodiments, the first layer 200 may be a conductive layer or an insulating layer. In some embodiments, the conductive layer may include a conductive material. In some embodiments, the aforementioned conductive material may include metal, metal nitride, semiconductor material or a combination thereof, or any other suitable conductive material, but the present disclosure is not limited thereto. In some embodiments, the conductive material may include gold (Au), nickel (Ni), platinum (Pt), palladium (Pd), iridium (Ir), titanium (Ti), chromium (Cr), tungsten (W), aluminum (Al), copper (Cu), titanium nitride (TiN), tantalum nitride (TaN), nickel silicide (Ni Si), cobalt silicide (CoSi), tantalum carbide (TaC), tantalum silicon nitride (TaSiN), tantalum carbonitride (TaCN), titanium aluminide (TiAl), titanium aluminum nitride (TiAlN), polysilicon, polycrystalline germanium, the like or a combination thereof. In some embodiments, the conductive layer may be formed on the supporting entity 100 by using, for example, a chemical vapor deposition (CVD), sputtering, the resistance heating vapor deposition, electron beam vapor deposition, or any other suitable deposition process. In some embodiments, the first layer 200 may be a conductive layer such as a layer of the patterned wiring.

In some embodiments, the insulating layer may include oxide, nitride, oxynitride, polymer, high dielectric constant (high-k) dielectric material, the like, or a combination thereof. In some embodiments, the polymer may include polyimide, polycarbonate (PC), polyethylene terephthalate (PET) or the like. In some embodiments, the insulating layer may be photosensitive polyimide (PSPI). In some embodiments, the insulating layer may be formed on the supporting entity 100 by, for example, spin coating or other suitable processes.

In some embodiments, the multilayer structure 1 may have a first layer 200 and a first test mark corresponding to the first layer 200 (for example, the first test mark 211 in FIG. 3). More specifically, the first test mark 211 may be disposed adjacent to the first layer 200. The first test mark 211 and the first layer 200 are in the same layer. In some embodiments, the first layer 200 and the first test mark 211 may include the same or different materials. For example, in some embodiments, a layer may be formed on the supporting entity 100. Then, the layer is patterned to form the first layer 200, and the first test mark 211 may be formed at the same time and be adjacent to the first layer 200. In other embodiments, the first patterning process may be performed on the layer disposed on the supporting entity 100 to form the first layer 200, and then the second patterning process may be performed to form the first test mark 211. In this embodiment, the first layer 200 and the first test mark 211 may include the same material. In other embodiments, after forming the first layer 200 with a pattern which may be used as a patterned wiring, the first test mark 211 may additionally include a material different from the first layer 200.

In some embodiments, there is a gap between the first layer 200 and the first test mark 211, so that the first layer 200 and the first test mark 211 are separated from each other. In some embodiments, the first test mark 211 may be disposed in a peripheral region of the first layer 200. As shown in FIG. 5, the position of the first test mark 211 may correspond to the edge portion of the supporting entity 100. In some embodiments, the first test mark 211 may be disposed in a region of the first layer 200 closer to the center.

Still referring to FIG. 3, in some embodiments, a single first test mark 211 or a plurality of first test marks 211 to 214 may be provided on the supporting entity 100. In some embodiments, the first test marks 211 to 214 may be disposed in the peripheral region of the first layer 200. In some embodiments, the first test mark 211 may have a predetermined length L1 in the extension direction thereof (for example, the Y-axis direction). More specifically, the predetermined length L1 of the first test mark 211 is an actual length of the first test mark 211 in the extending direction thereof. The predetermined length L1 may be obtained from the design value in the design layout, but the method of obtaining the predetermined length L1 is not limited thereto. In addition, in the embodiment which includes the plurality of first test marks 211 to 214, the respective extending directions and respective predetermined lengths of the first test marks 211 to 214 may be the same or different. As shown in FIG. 3, in some embodiments, the extending directions of the first test mark 211 and another first test mark 212 may be different. In some embodiments, the first test mark 211 and the first test mark 213 extend along the Y-axis direction, and the first test mark 211 and the first test mark 213 may be separated or at least partially overlap each other in the X-axis direction. In some embodiments, the first test mark 212 and the first test mark 214 extend along the X-axis direction, and the first test mark 212 and the first test mark 214 may be separated or at least partially overlap each other in the Y-axis direction.

As shown in FIG. 4, the first layer 200 may be disposed on the supporting entity 100, and the first test mark 211 may correspond to the first layer 200. In some embodiments, there is a gap between the first test mark 211 and the first layer 200, and the aforementioned gap may penetrate the first layer 200 to expose a top surface of the supporting entity 100.

As shown in FIG. 5, the top surface of the supporting entity 100 is covered by the first layer 200 and the first test marks 211 to 214. A portion of the supporting entity 100 is exposed from the gap between the first layer 200 and the first test marks 211 to 214.

Figure 6:
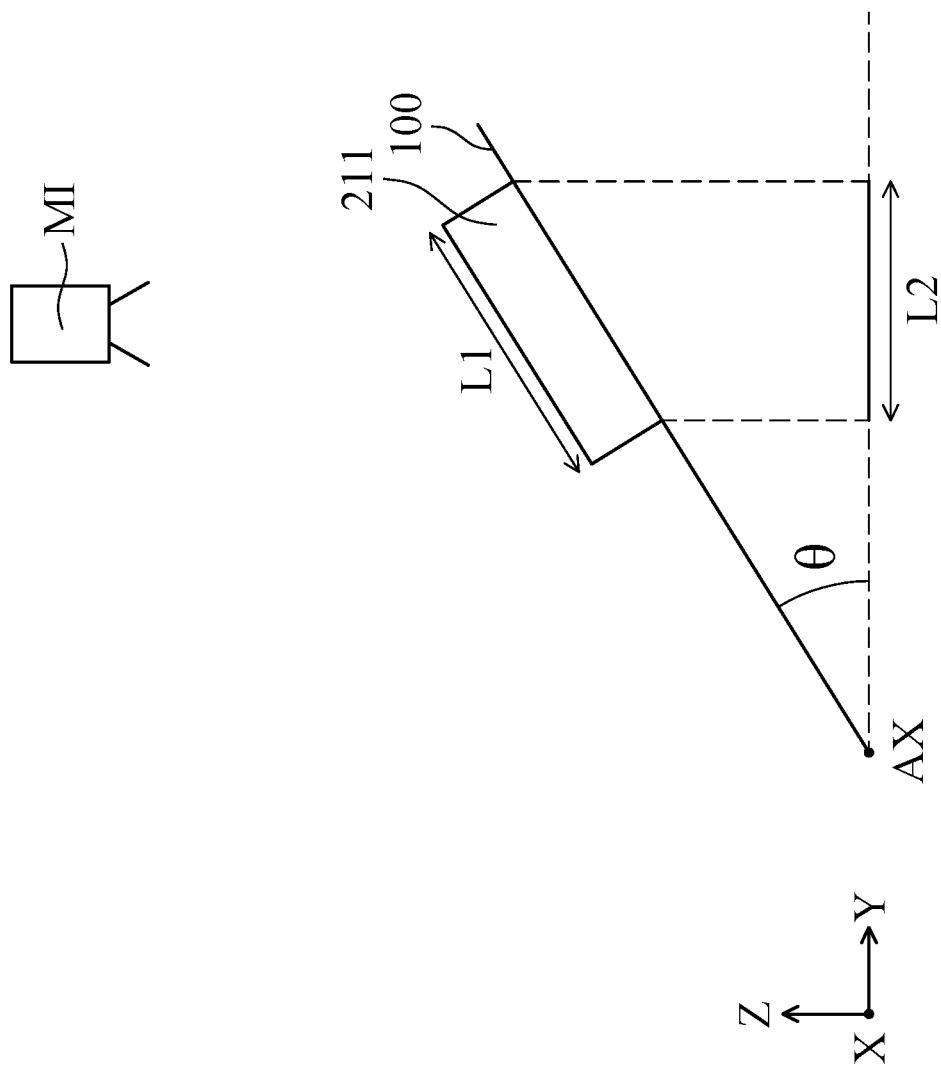
FIG. 6 is a schematic view illustrating measurement steps in a manufacturing method of a multilayer structure according to some embodiments of the present disclosure.

Referring to FIG. 6, which is a schematic view illustrating measurement steps in a manufacturing method of a multilayer structure according to some embodiments of the present disclosure. In some embodiments, after disposing the first layer 200 on the supporting entity 100, the projection length L2 of the first test mark 211 in the top view may be measured by a measuring instrument MI. Then, the warpage degree of the first layer 200 may be calculated according to the predetermined length L1 and the projected length L2 of the first test mark 211.

For a brief description, the following uses the first test mark 211 as an example for calculating the warpage degree, but the present disclosure is not limited thereto. In the present disclosure, each test mark such as the first test mark 211 and the subsequently formed second test mark may be used to calculate the warpage degree. Furthermore, for ease of description, the supporting entity 100 is shown as a line segment in FIG. 6. However, the supporting entity 100 substantially has a thickness.

As shown in FIG. 6, in some embodiments, the first test mark 211 is disposed on the supporting entity 100, and the first test mark 211 has a predetermined length L1. In FIG. 6, it is shown that after the formation of the first layer (not shown) and the first test mark 211 on the supporting entity 100, a warping angle θ is generated. Then, the projection length L2 of the first test mark 211 is measured in the top view by using the measuring instrument MI (for example, an optical inspection device). In other words, the projection length L2 may be the length of the predetermined length L1 projected onto the XY plane.

In some embodiments, the measuring instrument MI may include an automated optical inspection device, but the present disclosure is not limited thereto. In some embodiments, the measuring instrument MI may include a camera. By taking a picture of the multilayer structure provided on the supporting entity 100 along the Z-axis direction by the measuring instrument MI, an image of the top view viewed in the Z-axis direction is obtained. Then, the projection length L2 of the first test mark 211 is measured by the image of the top view. That is, the length of the first test mark 211 in the image of the top view is substantially equal to the projection length L2 of the first test mark 211.

Next, after obtaining the predetermined length L1 and the projection length L2 of the first test mark 211, the warping angle θ is calculated by the following formula (1), wherein the warping angle θ may show the warpage degree. The greater the warping angle θ, the greater the warpage degree.

$$\theta = \cos^{-1}(L2/L1) \qquad \text{formula (1)}$$

For example, the predetermined length L1 of first test mark 211 is 500 um, and the projected length L2 of the first test mark 211 is 460 um. The values of the predetermined length L1 and the projection length L2 are applied into the formula (1) to know that the warping angle θ is about 23 degrees.

It should be particularly noted that, when the warping angle θ of a measuring region is obtained by applying the values of the predetermined length L1 and the projection length L2 into the formula (1), the warping angle θ is equivalent to the angle of the warpage of the measuring region, wherein the region is warped with an imaginary rotating axis AX as a rotating axis upward from the XY plane (Z-axis direction). The extending direction of the imaginary rotating axis AX (for example, the X-axis direction) may be parallel to the surface of the supporting entity 100 and may be perpendicular to the extending direction of the first test mark 211 (for example, the Y-axis direction). In other words, the extending direction of the first test mark 211 may be perpendicular to the extending direction of the imaginary rotating axis AX. For example, an integral structure is formed by forming the first layer 200 and the first test mark 211 on the supporting entity 100. Thus, the 23 degrees obtained in the above example may be regarded as a measured angle of a portion of the integral structure in the measuring region, wherein the portion of the integral structure rotates with the imaginary rotating axis AX as the rotating axis.

Accordingly, by disposing single or the plurality first test mark(s) 211 and measuring the length(s) or width(s) of the single or the plurality of first test mark(s) 211, the degrees of the warpage of the supporting entity 100 in the different positions and directions during the formation of the multilayer structure are calculated.

In some other embodiments, the first test mark 211 may have a predetermined width (not shown) and a projection width (not shown) in different directions, and the predetermined width and the projection width may also be applied into the formula (1), in order to obtain the angle of warpage in the different directions.

In some other embodiment, the predetermined length L1 may also be the distance between any two test marks, and the projection length L2 may be the distance between the two test marks projected in the image of the top view. In other words, the predetermined length L1 and the projected length L2 may be respectively the designed value of the distance between any two test marks and the value of the distance actually measured from the image of the top view. Thus, the predetermined length L1 and the projected length L2 are not limited to the predetermined length and the projected length of a single test mark. For example, in some embodiments, the predetermined length L1 may be a design value of the distance between an end of the first test mark 211 and an end of another first test mark 212. The projection length L2 may be the actually measured distance between the end of the first test mark 211 and the end of another first test mark 212 in the image of the top view. The projection length L2 may be the distance between the end of the first test mark 211 projected in the top view and the end of the first test mark 212 projected in the top view.

Figure 7:
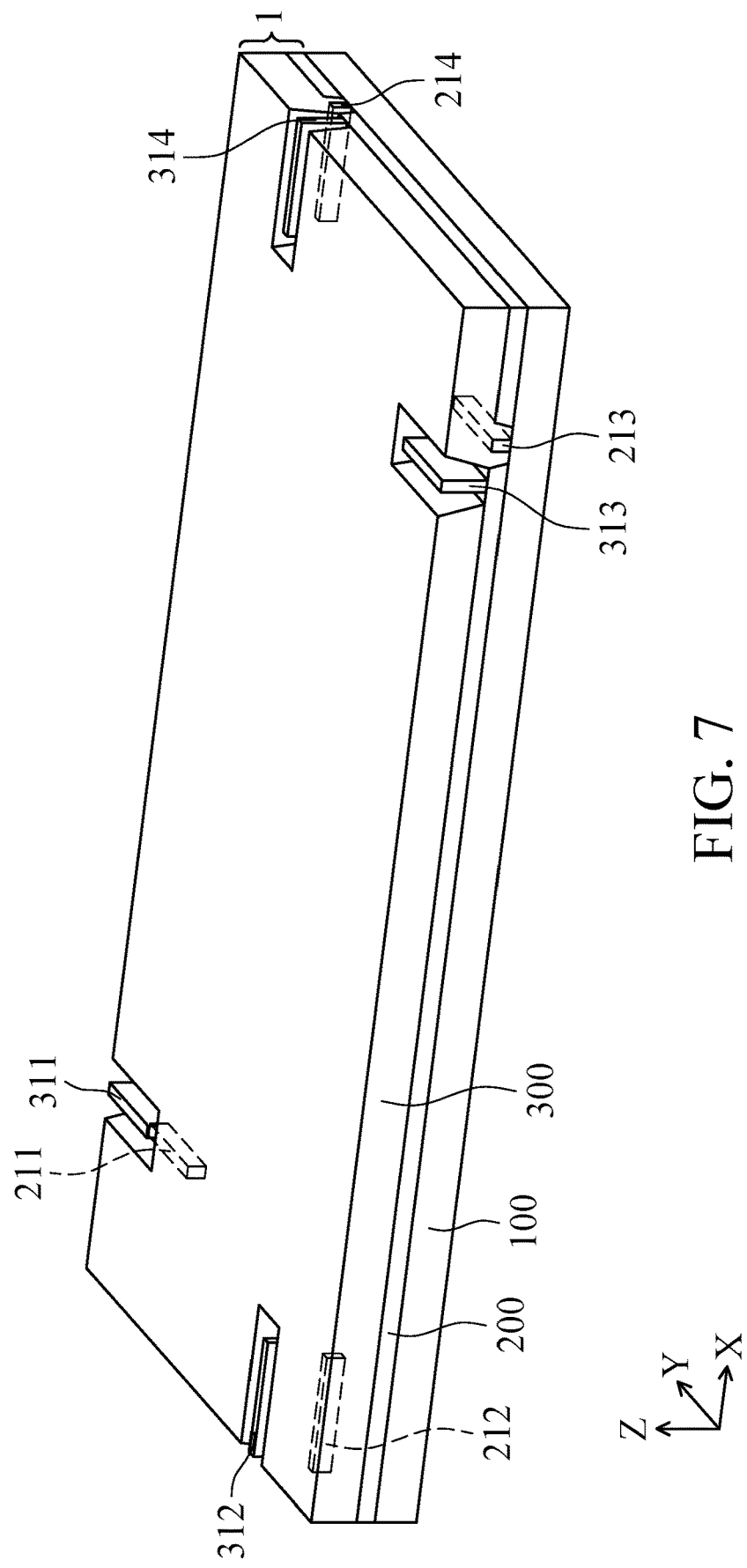
FIG. 7 to FIG. 9 are respectively a schematic three-dimensional view, a schematic cross-sectional view, and a schematic top view of manufacturing a multilayer structure at various stages according to some embodiments of the present disclosure.
Figure 8:
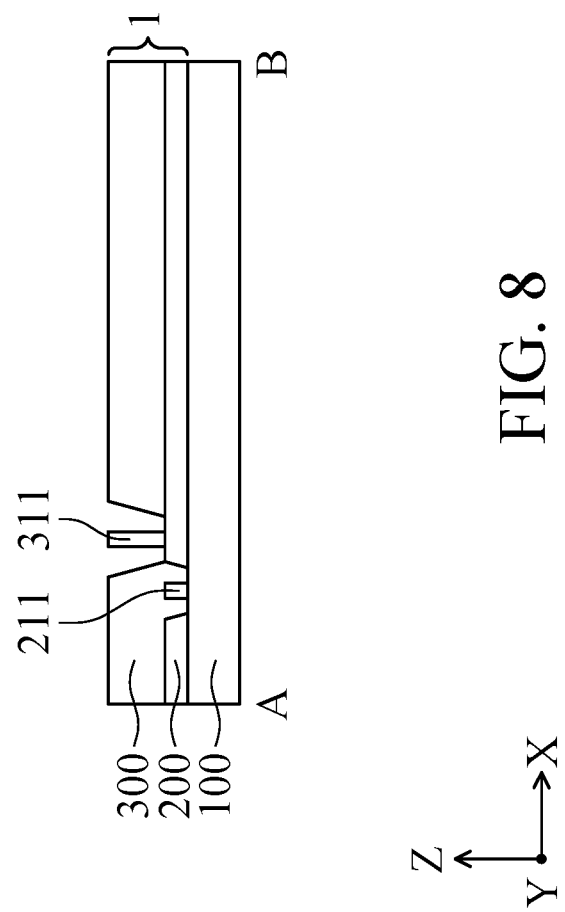
Figure 9:
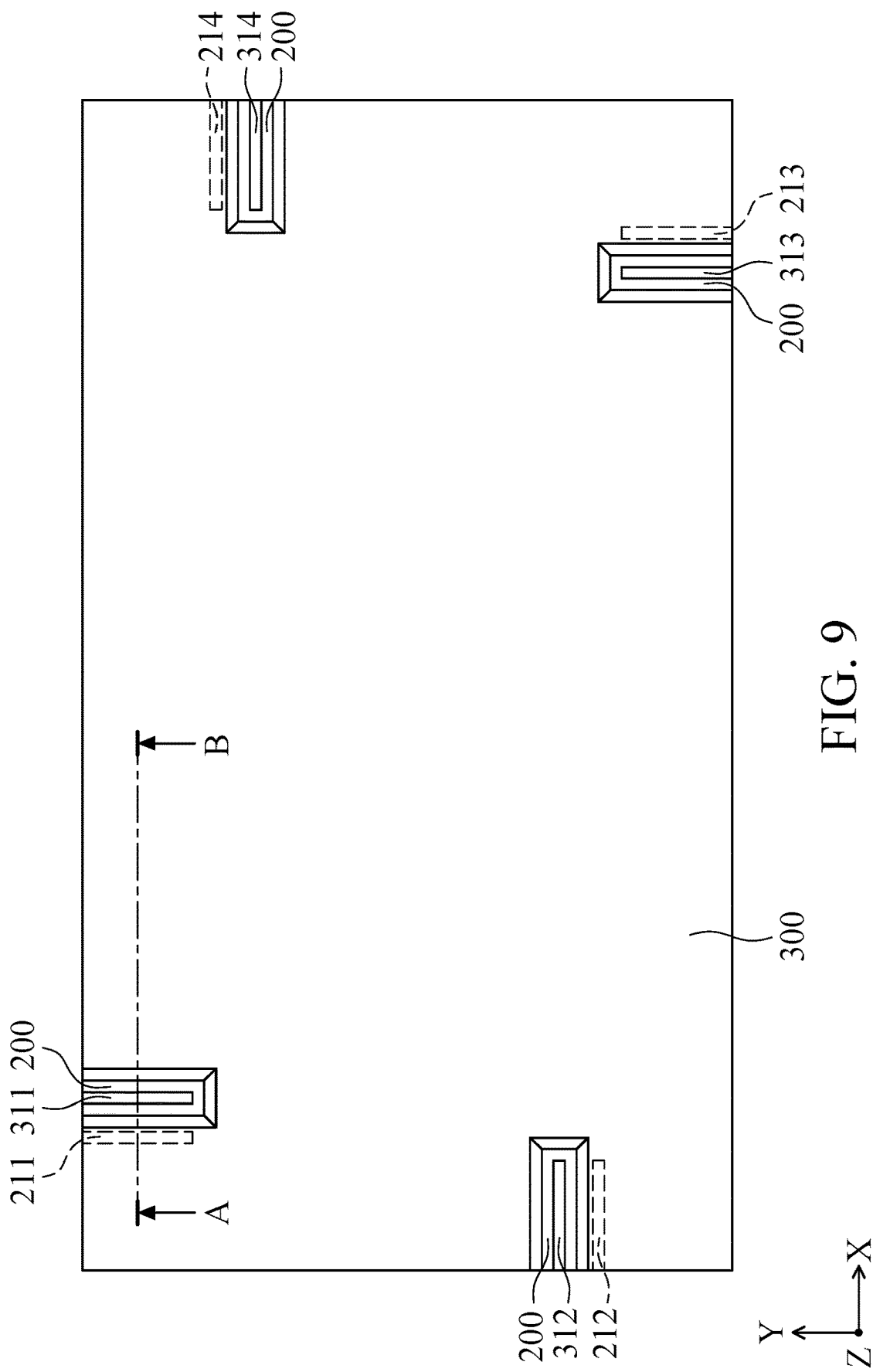

Referring to FIGS. 7 to 9, which are respectively a schematic three-dimensional view, a schematic cross-sectional view, and a schematic top view of manufacturing the multilayer structure 1 at various stages according to some embodiments of the present disclosure, wherein FIG. 9 is a schematic top view of FIG. 7, and FIG. 8 is a cross-sectional view taking along line AB of FIG. 9.

As shown in FIG. 7, the second layer 300 is formed on the first layer 200. In some embodiments, the second layer 300 is formed directly on the first layer 200. In some embodiments, the second layer 300 is in direct contact with the first layer 200. In some embodiments, the second layer 300 is blanketly formed on the first layer 200, and then a planarization process such as chemical mechanical polishing is performed to the second layer 300, but the present disclosure is not limited thereto.

In some embodiments, the second layer 300 may be a conductive layer or an insulating layer. More specifically, in some embodiments, one of the first layer 200 and the second layer 300 is a conductive layer, and the other of the first layer 200 and the second layer 300 is an insulating layer. For example, in some embodiments, the first layer 200 is a conductive layer, and the second layer 300 is an insulating layer. In other embodiments, the first layer 200 is an insulating layer, and the second layer 300 is a conductive layer. In some embodiments, the conductive layer may be a patterned wiring layer. In other words, the first layer 200 or the second layer 300 that is a conductive layer may be a patterned wiring layer.

For ease of understanding, the first layer 200 is a conductive layer and the second layer 300 is an insulating layer as an example for description. In some embodiments, the first layer 200 includes copper or other suitable conductive metal, and the second layer 300 includes photosensitive polyimide or other suitable insulating layer.

As shown in FIG. 7, in some embodiments, the second test mark 311 may correspond to the second layer 300. More specifically, the second test mark 311 and the second layer 300 may be in the same layer. The second test mark 311 may be adjacent to the second layer 300. In some embodiments, the second layer 300 and the second test mark 311 may include the same or different materials. The formation methods may be the same as or similar to the aforementioned formation method of the first layer 200 and the first test mark 211. The formation methods of the second layer 300 and the second test mark 311 will not be repeated here. As shown in FIG. 7, the multilayer structure 1 may include a first layer 200, the first test marks 211 to 214, a second layer 300, and the second test marks 311 to 314.

Still referring to FIG. 7, in some embodiments, the arrangement of the second test mark 311 may be the same as or different from the arrangement of the first test mark 211. In some embodiments, a single second test mark 311 or a plurality of second test marks 311 to 314 may be provided. The arranging method may be the same as or similar to the aforementioned arranging method of the first test mark 211. The arranging method of the second test mark 311 will not be repeated here.

Referring to FIGS. 7 to 9, in some embodiments, the second test marks 311, 312, 313, and 314 and the first test marks 211, 212, 213, and 214 do not overlap in the Z-axis direction. That is, in some embodiments, when observed in the top view, the projections of the second test marks 311, 312, 313, and 314 on the supporting entity 100 may not overlap the projections of the first test marks 211, 212, 213, and 214 on the supporting entity 100, but the present disclosure is not limited thereto. In some embodiments, the projections of the second test marks 311, 312, 313, and 314 on the supporting entity 100 may at least partially overlap the projections of the first test marks 211, 212, 213, and 214 on the supporting entity 100.

As shown in FIG. 8, the second layer 300 may be disposed on the first layer 200, and the second test mark 311 may also be disposed on the first layer 200. In some embodiments, there is a gap between the second test mark 311 and the second layer 300, and the top surface of the first layer 200 is exposed. Since a planarization process may be performed to the second layer 300 before the second test mark 311 is formed, the planarization process may reduce the unevenness of the second layer 300 caused by the gap between the first test mark 211 and the first layer 200. In addition, the second test mark 311 and the first test mark 211 may or may not overlap in the Z-axis direction. However, when the second test mark 311 and the first test mark 211 do not overlap in the Z-axis direction, the noise during measurement may be reduced to improve the accuracy of the measurement.

As shown in FIG. 9, the top surface of the first layer 200 may be exposed by the gap between the second layer 300 and the second test marks 311 to 314. Similarly, after the formation of the second test mark 311, the structure including the second layer 300, the first layer 200, and the supporting entity 100 may be photographed by the measuring instrument MI in the Z-axis direction, in order to obtain the image of the top view.

Then, the projection length of the second test mark 311 is measured by the image of the top view. Therefore, the warping angle at the position of the second layer 300 corresponding to the second test mark 311 may be calculated by the aforementioned formula (1) in the same way. The calculated warpage angle may reflect the warpage degree of the second layer 300. More specifically, since the second layer 300 and the first layer 200 may be bonded with the supporting entity 100 to forms a whole structure, the calculated warpage angle may reflect the degrees of the warpage of whole structure after the formation of the second layer 300 and the second test mark 311. It should be noted that due to differences in materials and manufacturing processes, when each new layer is formed, the warpage degree of the whole structure including the supporting entity 100 and the multilayer structure 1 may be changed accordingly. Therefore, in some embodiments, the warping angle θ calculated by the measurement of the first test mark 211 and the warping angle calculated by the measurement of the second test mark 311 may be the same or different. In other words, the warpage degree of the first layer 200 corresponding to the position of the first test mark 211 and the warpage degree of the second layer 300 corresponding to the position of the second test mark 311 may be the same or different. It should be noted that, when it is necessary to continuously observe the degrees of warpage of a specific position on the supporting entity 100 at different stages of the processes, the position of the test mark corresponding to each layer (for example, the first test mark 211 corresponding to the first layer 200 and the second test mark 311 corresponding to the second layer 300) may be specifically disposed, in order to make the projections of the test marks of each layer on the supporting entity 100 as close as possible to or even overlap the specific position. Furthermore, by observing the change in the warpage degree, the influence of the each layer to the whole structure in the warpage degree may be understood. Therefore, according to the test marks on each film layer, the influence on the supporting entity 100 and the multilayer structure 1 after the formation of different layers may be measured.

In some embodiments, a compensation process may be further performed to reduce the warpage degree of the multilayer structure 1. In some embodiments, the compensation process may be a heating process or a forming process of a reverse warpage layer (wherein, the warpage trend of the reverse warpage layer is different from the warpage direction of the multilayer structure 1), but the present disclosure is not limited thereto.

Figure 10:
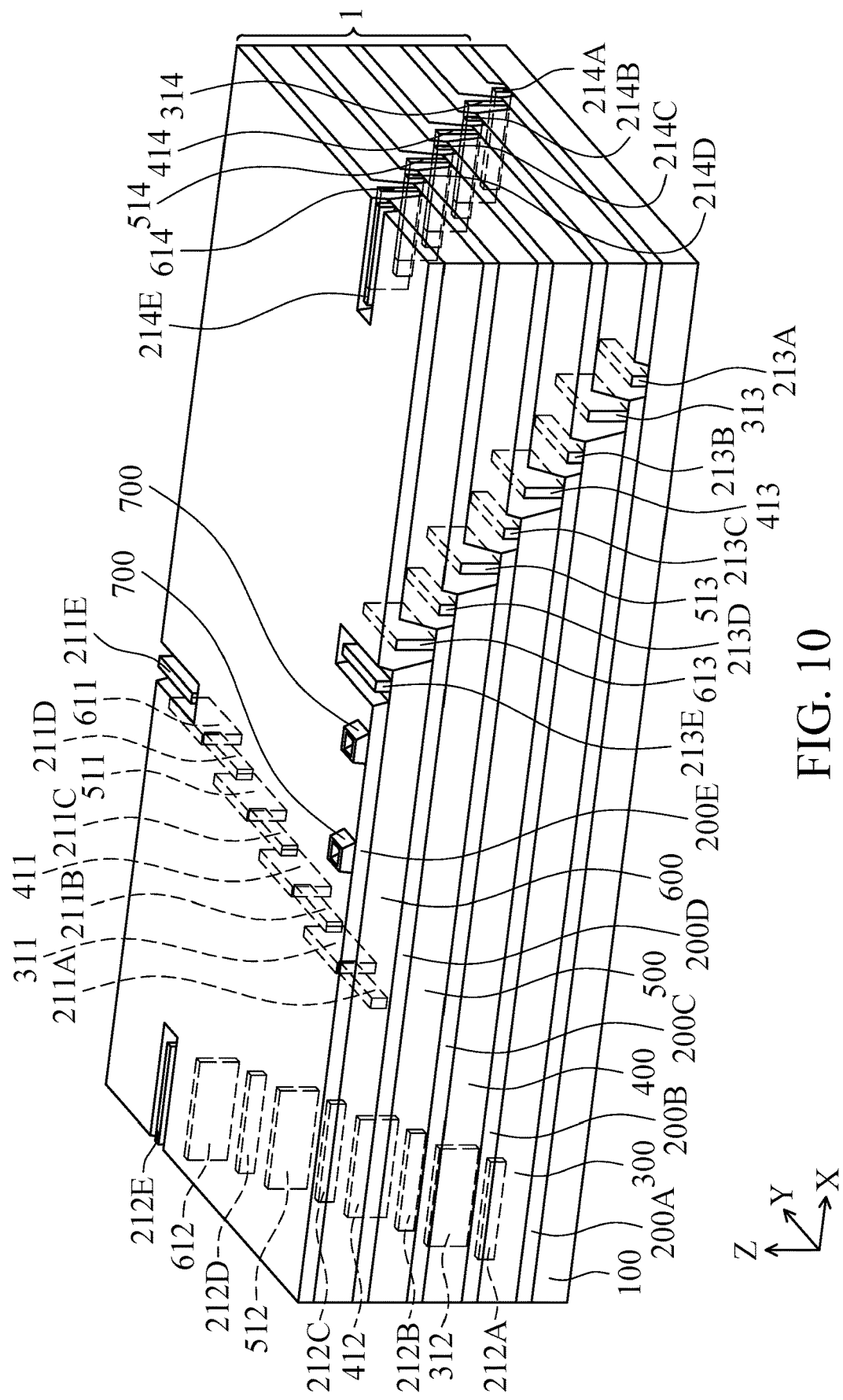
FIG. 10 to FIG. 12 are respectively a schematic three-dimensional view, a schematic cross-sectional view, and a schematic top view of manufacturing a multilayer structure at various stages according to some embodiments of the present disclosure.
Figure 11:
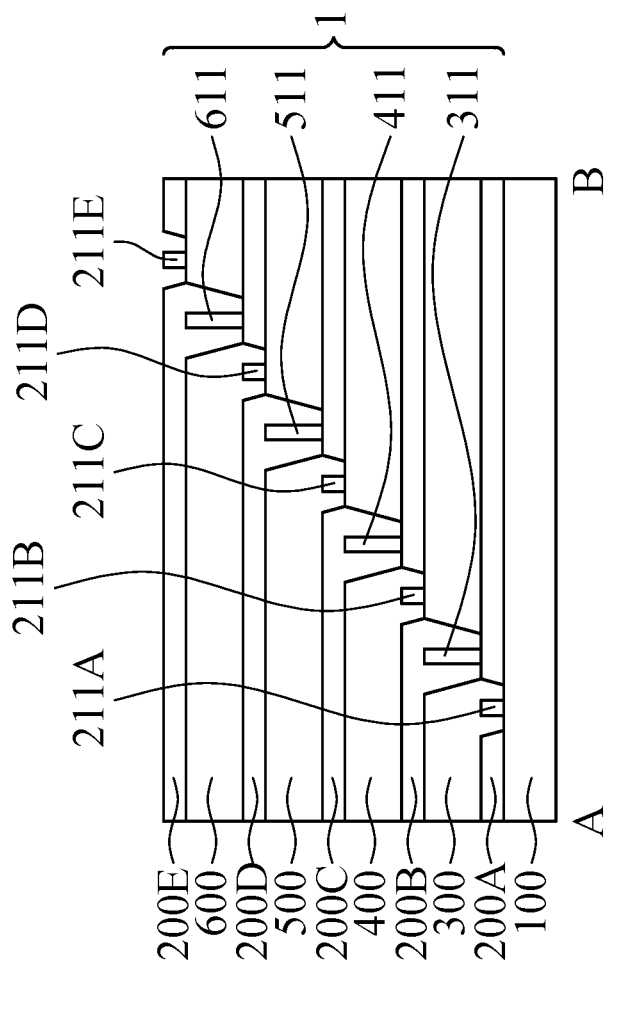
Figure 12:
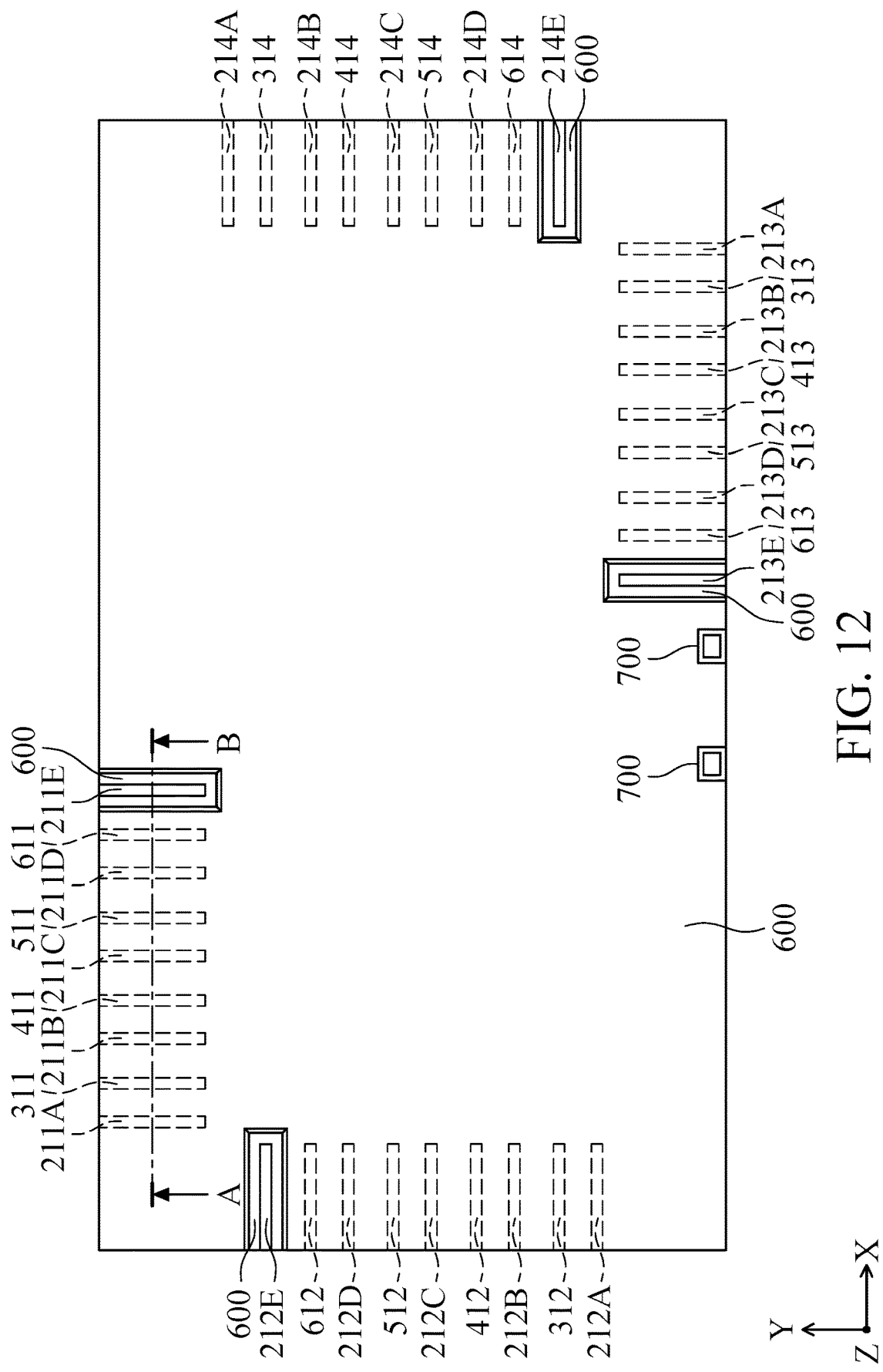

Referring to FIGS. 10 to 12, which are respectively a schematic three-dimensional view, a schematic cross-sectional view, and a schematic top view of manufacturing the multilayer structure 1 at various stages according to some embodiments of the present disclosure, wherein FIG. 12 is a schematic top view of FIG. 10, and FIG. 11 is a cross-sectional view taking along line AB of FIG. 12.

For ease of understanding, the conductive layer and the insulating layer are stacked alternately with each other as an example of the multilayer structure 1, wherein the first layers 200A, 200B, 200C, 200D, and 200E are conductive layers, and the second layer 300, a third layer 400, a fourth layer 500, and a fifth layer 600 are insulating layer, but the present disclosure is not limited thereto.

As shown in FIG. 10, in some embodiments, the multilayer structure 1 disposed on the supporting entity 100 may include the first layer 200A, the second layer 300, the first layer 200B, the third layer 400, the first layer 200C, the fourth layer 500, the first layer 200D, the fifth layer 600, and the first layer 200E. The multilayer structure 1 may also include the first test marks 211A to 214A corresponding to the first layer 200A, the first test marks 211B to 214B corresponding to the first layer 200B, the first test marks 211C to 214C corresponding to the first layer 200C, the first test marks 211D to 214D corresponding to the first layer 200D, and the first test marks 211E to 214E corresponding to the first layer 200E. The multilayer structure 1 may further include the second test marks 311 to 314 corresponding to the second layer 300, the third test marks 411 to 414 corresponding to the third layer 400, the fourth test marks 511 to 514 corresponding to the fourth layer 500, and the fifth test marks 611 to 614 corresponding to the fifth layer 600. In some embodiments, the test marks in each layer may not overlap in the Z-axis direction, but the present disclosure is not limited thereto.

In some embodiments, the contact 700 may be formed on the first layer 200E to electrically connect the multilayer structure 1 with other components. In some embodiments, the contact 700 may include a metal, a metal nitride, a semiconductor material, a combination thereof, or any other suitable conductive material. In some embodiments, the contact 700 may be formed on the first layer 200E by, for example, chemical vapor deposition, sputtering, resistance heating evaporation, electron beam evaporation, or any other suitable deposition process.

As shown in FIG. 11, similar to FIG. 8, there is a gap between the first test mark 211E and the first layer 200E, and the opening may penetrate through the first layer 200E to expose the top surface of the fifth layer 600. In some embodiments, an encapsulation layer, a protective layer or any other functional layer may be further formed on the first layer 200E.

As shown in FIG. 12, the top surface of the fifth layer 600 is exposed by the gap between the first layer 200E and the first test marks 211E to 214E.

Figure 13:
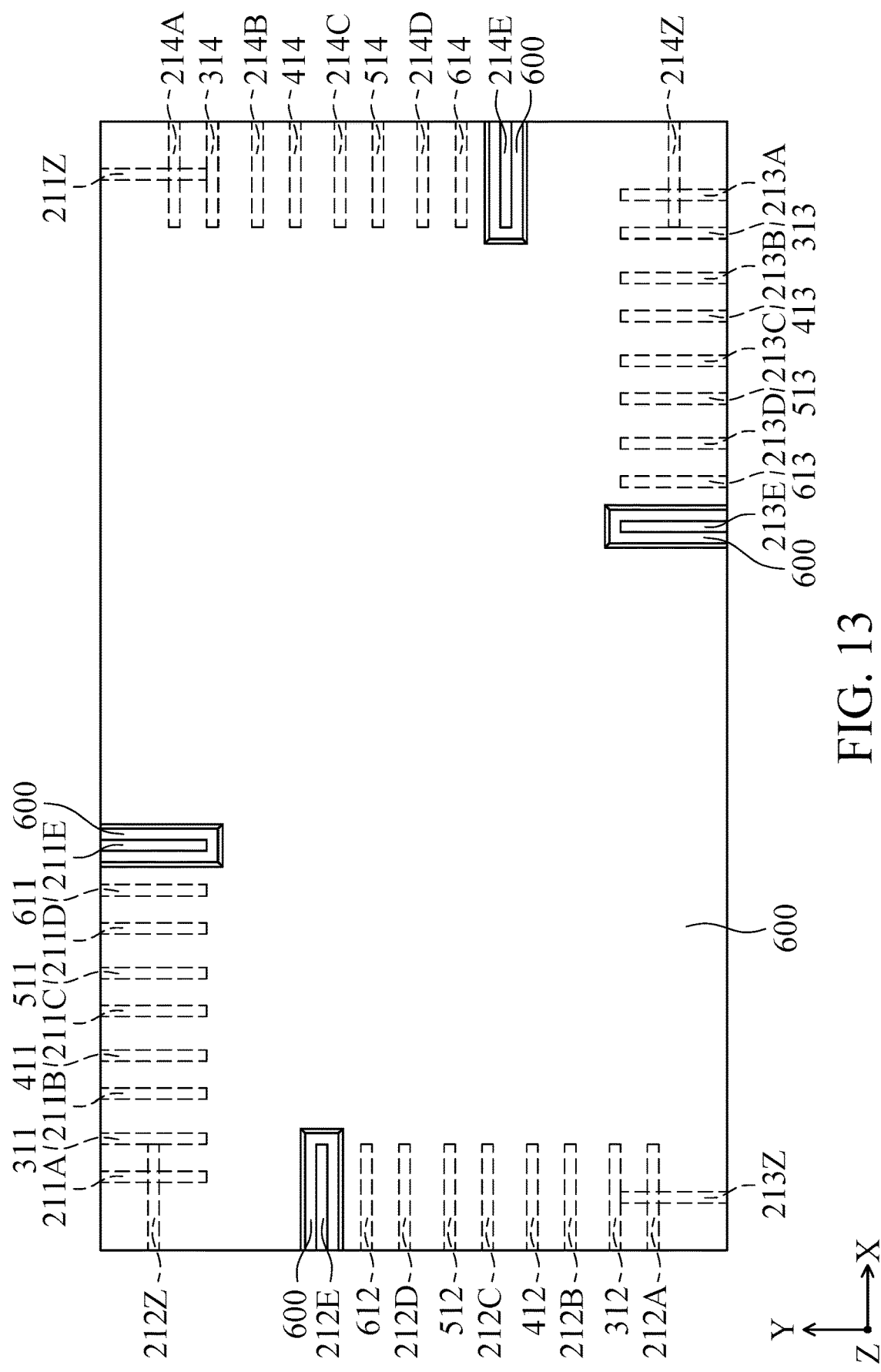
FIG. 13 and FIG. 14 are schematic top views of a multilayer structure according to some embodiments of the present disclosure.

Referring to FIG. 13, which is a schematic top view of a multilayer structure according to some embodiments of the present disclosure.

As shown in FIG. 13, in some embodiments, one first test mark may partially overlap another first test mark. For example, the first test mark 211A extending along the Y-axis direction in the first layer 200 may partially overlap the first test mark 211Z extending along the X-axis direction in the first layer 200. In other words, the first test marks in the same layer may partially overlap each other in the Z-axis direction. Therefore, the warpage degree at the corner of the multilayer structure 1 may be further calculated by the test mark at the corner of the multilayer structure 1. For example, in some embodiments, the first test mark 211A extends along the Y-axis direction. Thus, it can be known from the aforementioned measurement and calculation methods that, according to the measurement result of the first test mark 211A, the warping angle corresponding to the imaginary rotating axis extending along the X-axis direction at the measurement position may be calculated. Another first test mark 211Z extends along the X-axis direction. Thus, according to the measurement result of the first test mark 211Z, the warping angle corresponding to another imaginary rotating axis extending along the Y-axis direction at the measurement position may be calculated.

In other embodiments, the first test mark 211A may be linear, arc-shaped, circular, oval, cross-shaped, L-shaped, reversed L-shaped, upside-down L-shaped, star-shaped, tic tac shape, triangle, rectangle, polygon or any other suitable shape. As described above, the first test mark 211A with a specific shape may be disposed in the multilayer structure to further calculate the warpage degree corresponding to the position of the first test mark 211A.

Figure 14:
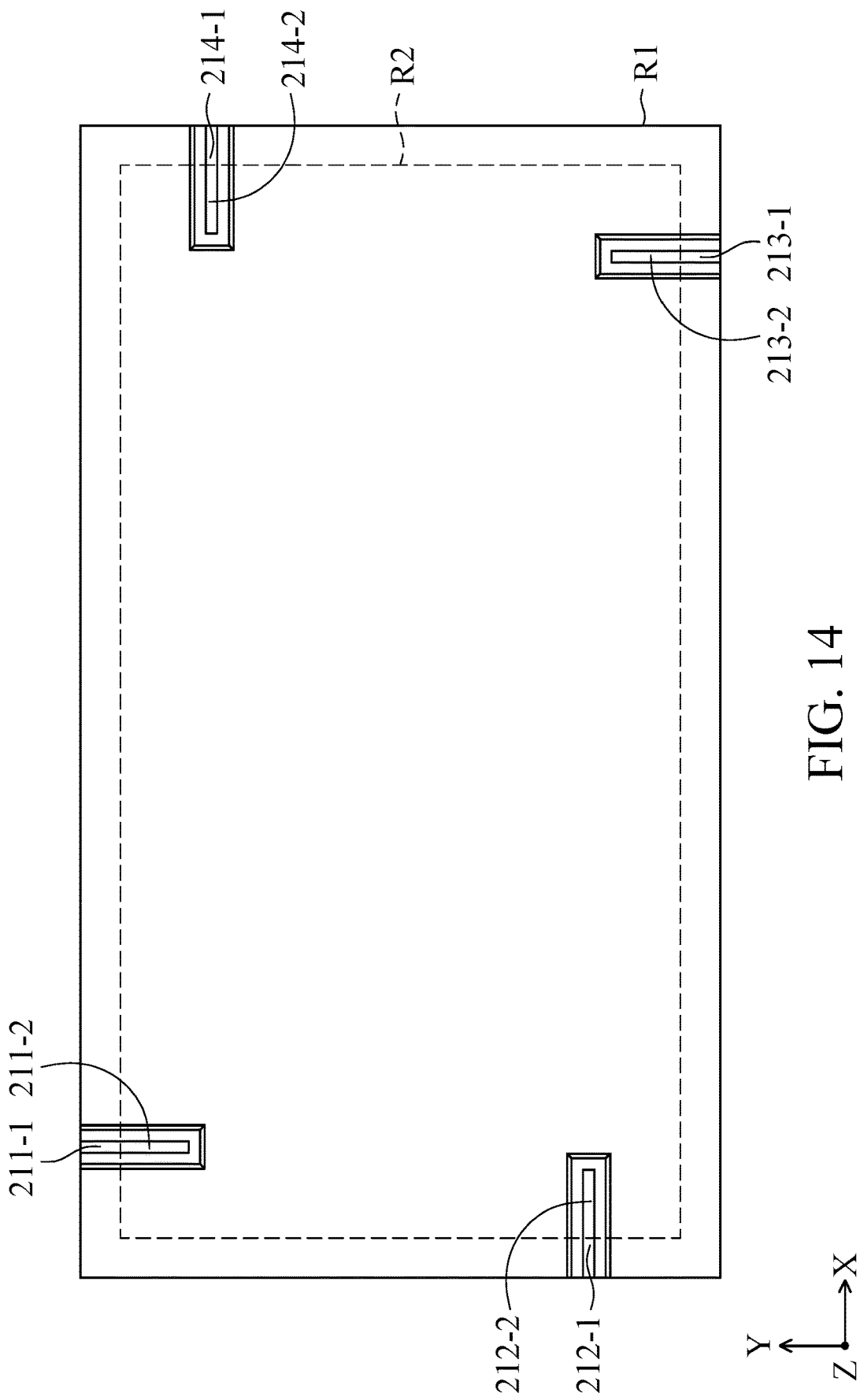

Refer to FIG. 14, which is a schematic top view of a multilayer structure according to some embodiments of the present disclosure, wherein FIG. 14 shows a multilayer structure including the first layer 200 and the supporting entity 100.

As shown in FIG. 14, in some embodiments, the supporting entity 100 includes a peripheral region R1 and a central region R2. In some embodiments, the peripheral region R1 surrounds the central region R2. In some embodiments, the patterned wiring may be disposed in the central region R2, and does not dispose in the peripheral region R1. In addition, a plurality of chips may be disposed in the central region R2, in order to perform a subsequent packaging process, such as fan-out panel-level packaging process to the multilayer structure, but the present disclosure is not limited thereto.

In some embodiments, the first layer 200 includes first test marks 211-1, 211-2, 212-1, 212-2, 213-1, 213-2, 214-1, and 214-2. In some embodiments, the first test marks 211-1, 212-1, 213-1, and 214-1 are disposed in the peripheral region R1. In some embodiments, the first test marks 211-2, 212-2, 213-2, and 214-2 are disposed in the central region R2 and are not connected to the patterned wiring. In other words, the first test marks 211-2, 212-2, 213-2, and 214-2 may be provided at positions where the patterned wiring is not provided in the central region R2.

In some embodiments, the first test mark 211-1 and another first test mark 211-2 extend in the same direction. In some embodiments, the first test mark 211-1 and another first test mark 211-2 are aligned with each other, but the present disclosure is not limited thereto. By disposing the first test mark 211-2 in the central region R2, the measuring range of warpage may be extended from the peripheral region R1 to the central region R2, and the warpage of the entire multilayer structure may be observed more comprehensively.

In summary, by disposing the test mark with the predetermined length on a layer and measuring the projected length via the optical inspection device, the present disclosure calculates the warpage degree according to the predetermined length and the projected length. Therefore, the present disclosure may reduce the time of manual measurement, improve the accuracy of measurement, and/or reduce damage to the multilayer structure. In addition, since the present disclosure may dispose various test marks according to the requirements of users, it can be widely used in various multilayer structures, and the warpage degree of the multilayer structure may be wholly obtained. In other words, the warpage degree of the corresponding position in the multilayer structure may be obtained with the placement position of the test mark.

Furthermore, the present disclosure may obtain the warpage degree of each layer one by one, so that it can effectively know the influence of different layers on the underlying layer. Thus, the control of the yield of the multilayer structure is achieved, the improvement of the multilayer structure is promoted and/or the reliability of the multilayer structure is increased. In addition, the present disclosure may be easily compatible with existing manufacturing processes, so that manufacturing costs may be reduced.

On the other hand, by disposing the test marks in the peripheral region and the central region at the same time, the warpage degree of the multilayer structure may be measured more comprehensively.

Although some embodiments of the present disclosure and their advantages have been disclosed, it should be understood that a person of ordinary skill in the art may change, replace and/or modify the present disclosure without departing from the spirit and scope of the present disclosure. In addition, the scope of the present disclosure is not limited to the process, machine, manufacturing, material composition, device, method, and step in the specific embodiments described in the specification. A person of ordinary skill in the art will understand current and future processes, machine, manufacturing, material composition, device, method, and step from the content disclosed in some embodiments of the present disclosure, as long as the current or future processes, machine, manufacturing, material composition, device, method, and step performs substantially the same functions or obtain substantially the same results as the present disclosure. Therefore, the scope of the present disclosure includes the above-mentioned process, machine, manufacturing, material composition, device, method, and steps. Moreover, each of the claims constitutes an individual embodiment, and the scope of the present disclosure also includes combinations of each of the claims and embodiments. The features among the various embodiments may be arbitrarily combined as long as they do not violate or conflict with the spirit of the disclosure.

The foregoing outlines features of several embodiments of the present disclosure, so that a person of ordinary skill in the art may better understand the aspects of the present disclosure. A person of ordinary skill in the art should appreciate that, the present disclosure may be readily used as a basis for designing or modifying other processes and structures for carrying out the same purposes and/or achieving the same advantages of the embodiments introduced herein. A person of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a multi-layered structure on a supporting entity, comprising:
    forming a first layer and a first test mark on the supporting entity, wherein the first test mark has a first predetermined length;
    measuring a first projected length of the first test mark in a top view; and
    calculating a first warpage degree of the first test mark according to the first predetermined length and the first projected length,
    wherein an angle of the first warpage degree is calculated by formula (1):

$$\theta = \cos^{-1}(L2/L1) \quad \text{formula (1)}$$

wherein L1 is the first predetermined length, L2 is the first projected length, and θ is the angle of the first warpage degree.

2. The method as claimed in claim 1, further comprising:
    forming a second layer and a second test mark on the first layer, wherein the second test mark has a second predetermined length.

3. The method as claimed in claim 2, further comprising:
    measuring a second projected length of the second test mark in a top view; and
    calculating a second warpage degree of the second test mark according to the second predetermined length and the second projected length.

4. The method as claimed in claim 3, wherein the first warpage degree is different from the second warpage degree.

5. The method as claimed in claim 2, wherein one of the first layer and the second layer is a conductive layer, and the other of the first layer and the second layer is an insulating layer.

6. The method as claimed in claim 1, further comprising:
   performing a compensation process, wherein the compensation process comprises a heating process or formation of a reverse warpage film.

7. The method as claimed in claim 1, wherein the supporting entity comprises a chip and a packaging material disposed around the chip.

\* \* \* \* \*